United States Patent
Yang et al.

(10) Patent No.: US 9,514,919 B2
(45) Date of Patent: Dec. 6, 2016

(54) BAFFLE AND SUBSTRATE TREATING APPARATUSES INCLUDING THE SAME

(75) Inventors: Seung-Kook Yang, Gyeonggi-do (KR); Jung-Hyun Kang, Gyeonggi-do (KR)

(73) Assignee: PSK INC., Gyeonggi-do (KR)

( * ) Notice: Subject to any disclaimer, the term of this patent is extended or adjusted under 35 U.S.C. 154(b) by 676 days.

(21) Appl. No.: 13/557,952

(22) Filed: Jul. 25, 2012

(65) Prior Publication Data

US 2013/0025787 A1 Jan. 31, 2013

(30) Foreign Application Priority Data

Jul. 25, 2011 (KR) .................. 10-2011-0073509

(51) Int. Cl.
| | | |
|---|---|---|
| *C23C 16/00* | (2006.01) | |
| *C23F 1/00* | (2006.01) | |
| *H01L 21/306* | (2006.01) | |
| *H01J 37/32* | (2006.01) | |

(52) U.S. Cl.
CPC .................. *H01J 37/32633* (2013.01)

(58) Field of Classification Search
CPC ................................ H01J 37/32623
USPC ................ 156/345.33, 345.34; 118/715
See application file for complete search history.

(56) References Cited

U.S. PATENT DOCUMENTS

| | | | | |
|---|---|---|---|---|
| 4,209,357 A | * | 6/1980 | Gorin et al. | ........... 438/710 |
| 5,024,748 A | * | 6/1991 | Fujimura | ........... 204/298.38 |
| 5,134,963 A | * | 8/1992 | Barbee et al. | ........... 118/715 |
| 6,415,736 B1 | | 7/2002 | Hao et al. | |
| 7,892,357 B2 | * | 2/2011 | Srivastava | ........... 118/715 |
| 2003/0218427 A1 | * | 11/2003 | Hoffman et al. | ........... 315/111.41 |
| 2008/0078744 A1 | * | 4/2008 | Wang et al. | ........... 216/67 |

FOREIGN PATENT DOCUMENTS

| | | |
|---|---|---|
| CN | 1577729 | 2/2005 |
| JP | 61-258427 | 11/1986 |
| JP | 5-315292 | 11/1993 |
| JP | 2001-148376 | 5/2001 |
| KR | 10-0593256 | 6/2006 |
| KR | 10-0726381 | 6/2007 |
| KR | 10-0984121 | 9/2010 |

OTHER PUBLICATIONS

English Machine Translation JP05315292, Nishikawa dated Nov. 26, 1993.*
Chinese Office Action for Application No. 20120252236.5 dated Sep. 25, 2014.

* cited by examiner

*Primary Examiner* — Rakesh Dhingra
(74) *Attorney, Agent, or Firm* — Jenkins, Wilson, Taylor & Hunt, P.A.

(57) ABSTRACT

Provided is a substrate treating apparatus, which includes a plasma generating part configured to generate plasma, a housing disposed under the plasma generating part, and having a space therein, a susceptor disposed within the housing and supporting a substrate, and a baffle including injection holes injecting the plasma supplied from the plasma generating part, to the substrate. The baffle includes a base in which the injection holes are formed, and a central portion of the base is thicker than an edge thereof.

18 Claims, 9 Drawing Sheets

BAFFLE AND SUBSTRATE TREATING APPARATUSES INCLUDING THE SAME

CROSS-REFERENCE TO RELATED APPLICATION

This U.S. non-provisional patent application claims priority under 35 U.S.C. §119 of Korean Patent Application No. 10-2011-0073509, filed on Jul. 25, 2011, the entire contents of which are hereby incorporated by reference.

BACKGROUND OF THE INVENTION

The present invention disclosed herein relates to a substrate treating apparatus, and more particularly, to a substrate treating apparatus including a baffle.

In semiconductor fabrication processes, a photoresist is used as a mask for forming minute circuit patterns on a substrate, or implanting ions therein. After that, the photoresist is removed from the substrate through an ashing process.

Such an ashing process uses plasma to remove a photoresist. High density plasma may be used in an ashing process to increase an ashing rate. The high density plasma may heat a baffle at a high temperature. When the baffle is continually heated at a high temperature, heat stress may occur within the baffle. Particularly, the central portion of the baffle to which plasma is directly supplied, has different temperatures in the top and bottom surfaces thereof, whereby tensile stress occurs on the top surface, and compressive stress occurs on the bottom surface. Accordingly, the central portion of the baffle may be bent in a convex shape protruding toward a plasma source. Such deformation of a baffle may cause a process defect, and a crack caused by the deformation may generate particles.

SUMMARY OF THE INVENTION

The present invention provides a baffle resistant to thermal deformation.

The present invention also provides a baffle that minimizes the generation of particles during a substrate treating process.

The present invention also provides a substrate treating apparatus that uniformly treats a substrate.

Embodiments of the present invention provide substrate treating apparatuses including: a plasma generating part configured to generate plasma; a housing disposed under the plasma generating part, and having a space therein; a susceptor disposed within the housing and supporting a substrate; and a baffle comprising injection holes injecting the plasma supplied from the plasma generating part, to the substrate, wherein the baffle comprises a base in which the injection holes are formed, and a central portion of the base is thicker than an edge thereof.

In some embodiments, the substrate treating apparatus may further include a sealing cover that seals an open top of the housing, and includes an introduction port through which plasma is introduced from the plasma generating part, wherein the central portion of the base faces the introduction port.

In other embodiments, the base may gradually decrease in thickness from the central portion thereof to the edge thereof.

In still other embodiments, the base may have a curved top surface protruding upward, and a flat bottom surface.

In even other embodiments, the base may have a curved top surface protruding upward, and a curved bottom surface protruding downward.

In yet other embodiments, the injection holes may include: a plurality of first injection holes disposed in the central portion of the base; and a plurality of second injection holes disposed in the edge of the base, and having radii greater than those of the first injection holes.

In further embodiments, a distance between the second injection holes may be greater than a distance between the first injection holes.

In still further embodiments, the baffle may further include a coupling part having a ring shape and protruding upward from a edge of the top surface of the base, and an upper end of the coupling part may be higher than a central portion of the top surface of the base.

In even further embodiments, the baffle may further include a rib part protruding from the upper end of the coupling part toward the central portion of the base, and spaced apart from the top surface of the base.

In yet further embodiments, a connecting region between a bottom surface of the rib part and an inner surface of the coupling part, and a connecting region between the inner surface of the coupling part and the top surface of the base may be rounded.

In much further embodiments, an exhausting hole may be disposed in a connecting region between the edge of the base and the coupling part, and be a through hole downwardly and obliquely extending from an inner surface of the coupling part to an outer surface thereof.

In still much further embodiments, the exhausting hole may be provided in plurality, and the exhausting holes may be spaced apart from each other along the coupling part, and have slit shapes.

In other embodiments of the present invention, baffles include: a plurality of injection holes configured to inject plasma; and a base in which the injection holes are formed, wherein a central portion of the base is thicker than an edge thereof.

In some embodiments, the base may have a curved top surface protruding upward, and a flat bottom surface.

In other embodiments, the base may have a curved top surface protruding upward, and a curved bottom surface protruding downward.

In still other embodiments, the baffle may further include a coupling part that has a ring shape and protrudes upward from a edge of the top surface of the base, and wherein an upper end of the coupling part is higher than a central portion of the top surface of the base.

In even other embodiments, the baffle may further include a rib part that protrudes from the upper end of the coupling part toward the central portion of the base, and is spaced apart from the top surface of the base.

In yet other embodiments, the baffle may further include exhausting holes that are disposed in a connecting region between the edge of the base and the coupling part, that are spaced apart from each other along the coupling part, and that are through holes downwardly and obliquely extending from an inner surface of the coupling part to an outer surface thereof.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. Detailed descriptions related to well-known functions or configurations will be ruled out in order not to unnecessarily obscure subject matters of the present invention.

Figure 1:
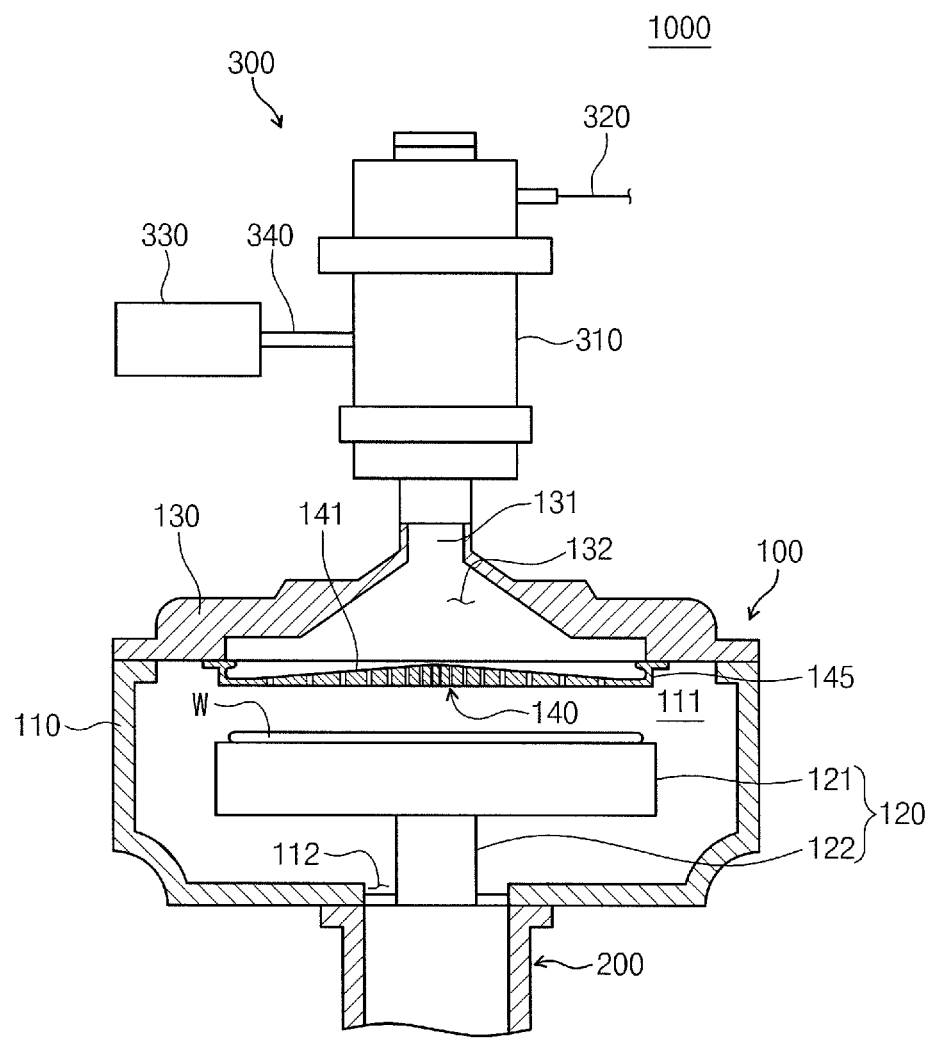
FIG. 1 is a view illustrating a substrate treating apparatus according to an embodiment of the present invention.

FIG. 1 is a view illustrating a substrate treating apparatus 1000 according to an embodiment of the present invention.

Referring to FIG. 1, the substrate treating apparatus 1000 includes a processing part 100, an exhausting part 200, and a plasma generating part 300. For example, the processing part 100 may perform an aching process on a substrate. The exhausting part 200 discharges a process gas staying within the processing part 100, and reaction by-products generated during a substrate treating process. The plasma generating part 300 generates plasma for processing a substrate W, and supplies the plasma to the processing part 100.

The processing part 100 includes a housing 110, a substrate support member 120, a sealing cover 130, and a baffle 140.

The housing 110 includes a space 111 therein. The ashing process is performed in the space 111. The housing 110 may include an open top wall, and an opening in a side wall thereof. A substrate is put in and taken out from the housing 110 through the opening of the side wall. The opening may be opened or closed by an opening/closing member such as a door (not shown). An exhausting hole 112 is disposed in the bottom of the housing 110. The exhausting hole 112 is connected to the exhausting part 200, and functions as a passage through which gas staying within the housing 110, and reaction by-produces generated during the ashing process are discharged to the outside.

The substrate support member 120 is disposed within the housing 110, and supports the substrate W. The substrate support member 120 includes a susceptor 121 and a supporting shaft 122. The susceptor 121 has a circular plate shape, and the substrate W is placed on the top surface thereof. An electrode unit (not shown) may be disposed within the susceptor 121. The electrode unit is connected to an external power source, and power is applied to the electrode unit to generate static electricity that fixes the substrate W to the susceptor 121. A heating coil (not shown) and a cooling coil (not shown) may be disposed within the susceptor 121. The heating coil heats the substrate W to a preset temperature. The substrate W may be heated to about 200° C. in the ashing process. The susceptor 121 may be formed of aluminum or ceramic to facilitate heater transfer to the substrate W. After being heated, the substrate W is forcibly cooled by the cooling coil. After a process is performed, the substrate W is cooled to a room temperature or a temperature appropriate for a subsequent process. The supporting shaft 122 has a cylindrical shape, and is disposed under the susceptor 121 to support the susceptor 121.

The sealing cover 130 is disposed on the upper portion of the housing 110, and seals the open top wall of the housing 110. The plasma generating part 300 is coupled to the upper end of the sealing cover 130. The sealing cover 130 includes an introduction port 131 and a guide space 132. The introduction port 131 is disposed in the upper end of the sealing cover 130, and functions as a passage through which plasma generated from the plasma generating part 300 is introduced. The guide space 132 is disposed under the introduction port 131, and has a passage through which plasma introduced from the introduction port 131 is supplied to the baffle 140. The guide space 132 may have an inverted funnel shape. Plasma spreads through the guide space 132.

The baffle 140 is disposed between the sealing cover 130 and the susceptor 121, and filters plasma supplied through the guide space 132. The plasma includes free radicals and ions. The free radicals have incomplete bonding, and are electrically neutral. The free radicals have considerably high reactivity, and process the substrate W substantially through chemical interaction with a material on the substrate W. The ions are electrically charged, and thus, are accelerated in a certain direction according to a potential difference. The accelerated ions process the substrate W by physically colliding with the material on the substrate W. Thus, the ions may collide with not only a photoresist layer but also substrate patterns in the ashing process. Accordingly, the substrate patterns may be damaged. In addition, the collision of the ions may change the quantity of electric charge of the substrate patterns, which affects a subsequent process. As such, when ions are directly supplied to the substrate W, the ions affect a process for the substrate W. To address these limitations due to ions, the baffle 140 is grounded. Accordingly, the free radicals of the plasma are moved to the substrate W, and the ions are prevented from moving thereto.

Figure 2:
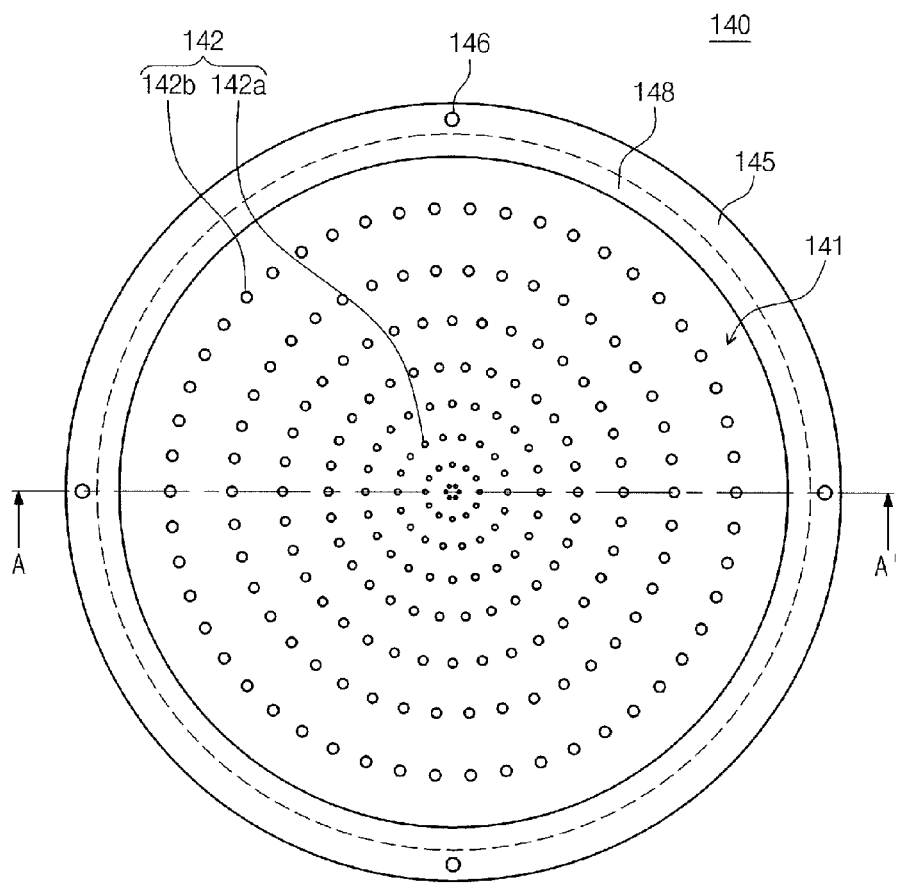
FIG. 2 is a plan view illustrating a baffle of FIG. 1.
Figure 3:
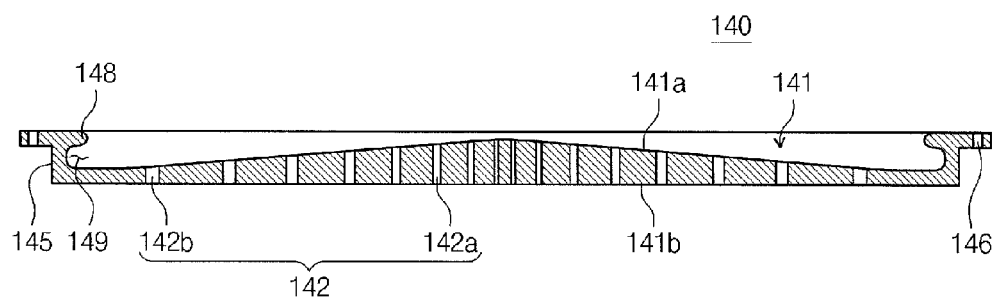
FIG. 3 is a cross-sectional view taken along line A-A' of FIG. 2.

FIG. 2 is a plan view illustrating a baffle of FIG. 1. FIG. 3 is a cross-sectional view taken along line A-A' of FIG. 2.

Referring to FIGS. 1 to 3, the baffle 140 includes a base 141, a coupling part 145, and a rib part 148. The base 141 has a thin circular plate shape. The central portion of the base 141 is thicker than the edge thereof. That is, the base 141 gradually decreases in thickness from the central portion thereof to the edge thereof. The central portion of the base 141 is disposed under the introduction port 131 to correspond thereto. The base 141 includes a top surface 141a that is curved. The central portion of the top surface 141a may protrude upward. The top surface 141a gradually increases in height from the edge thereof to the central portion thereof. The top surface 141a is symmetrical with respect to the center point of the base 141. The base 141 includes a bottom surface 141b that is flat, unlike the top surface 141a. Thus, the top surface 141a has an area greater than that of the bottom surface 141b. The base 141 is unevenly heated by the plasma, according to portions thereof. Since the top surface 141a faces the guide space 132, the top surface 141a is heated to a higher temperature than the bottom surface 141b is. Since the central portion of the base 141 is just below the introduction port 131, a larger amount of plasma is supplied to the central portion of the base 141 than to the edge thereof. Accordingly, the central portion of the base 141 is heated to a higher temperature than the edge thereof is. As such, since the central portion of the top surface 141a is heated to a higher temperature than the other portions thereof are, the central portion of the top surface 141a is susceptible to deformation due to heat stress. However, since the central portion of the base 141 is thicker than the edge thereof, deformation of the central portion due to heat stress can be decreased. Particularly, although a temperature difference between the top surface 141a and the bottom surface 141b is greater in the central portion of the base 141 than in the edge thereof, since the central portion is thicker than the edge, a temperature difference per unit thickness is smaller in the central portion than in the edge. In addition, since the top surface 141a gradually decreases in height from the central portion thereof to the edge thereof, heat stress due to a temperature difference is gradually varied from the central portion thereof to the edge thereof. In addition, since the top surface 141a is a convex surface, the area thereof is greater than that of a flat surface, and thus, heat transferred from plasma is dispersed more widely. Accordingly, heat stress generated in the base 141 is dispersed so as to decrease thermal deformation thereof.

The base 141 is provided with injection holes 142. The injection holes 142 are through holes extending from the top surface 141a to the bottom surface 14 lb. The injection holes 142 function as paths through which free radicals migrate. The injection holes 142 are disposed all over the base 141. The injection holes 142 may be classified into first injection holes 142a and second injection holes 142b. The first injection holes 142a are disposed in the central portion of the base 141, and the second injection holes 142b are disposed in the edge of the base 141. The second injection holes 142b may have radii greater than those of the first injection holes 142a. A distance between the second injection holes 142b may be greater than a distance between the first injection holes 142a. The first injection holes 142a may have passage lengths greater than those of the second injection holes 142b.

The coupling part 145 is disposed on the top surface 141a of the base 141. The coupling part 145 protrudes upward from the edge of the base 141. The coupling part 145 has a ring shape. The upper end of the coupling part 145 is higher than the central portion of the top surface 141a. The coupling part 145 is provided with coupling holes 146. Bolts (not shown) are inserted in the coupling holes 146. The bolts couple the coupling part 145 to the sealing cover 130. The top surface of the coupling part 145 contacts the bottom surface of the sealing cover 130. The coupling part 145 spaces the plasma generating part 300 apart from the base 141. If the base 141 directly contacts the sealing cover 130, the distance between the plasma generating part 300 and the top surface 141a that protrudes upward is decreased, and thus, sensitivity of the top surface 141a to the plasma generating part 300 as a heat source is increased. Accordingly, the base 141 may be susceptible to thermal deformation. Instead of directly coupling the base 141 to the sealing cover 130, the base 141 is spaced a certain distance from the plasma generating part 300 by the coupling part 145, thereby decreasing sensitivity of the base 141 to heat.

Figure 4A:
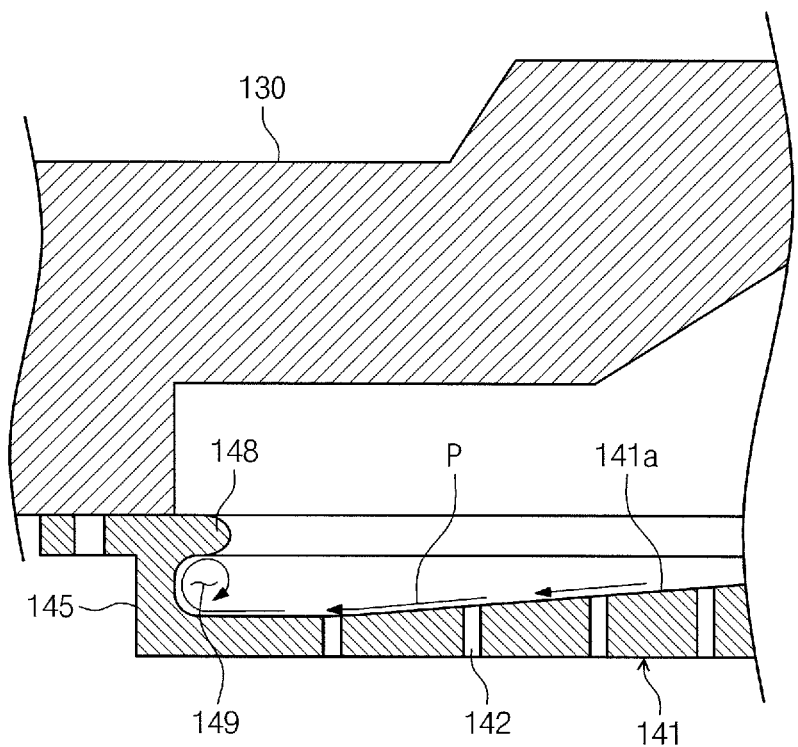
FIG. 4A is a cross-sectional view illustrating an eddy generated when a rip part is provided.
Figure 4B:
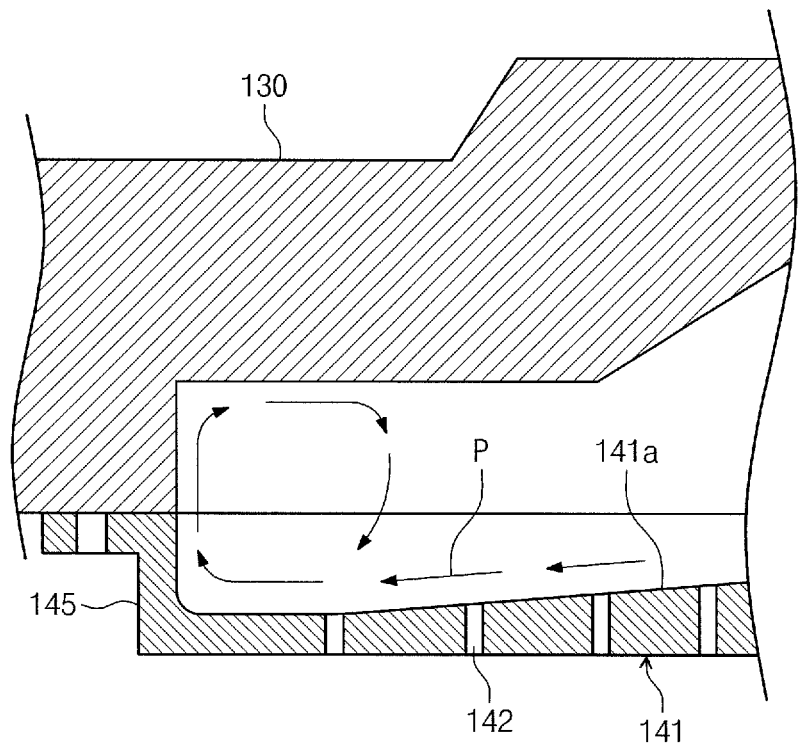
FIG. 4B is a cross-sectional view illustrating an eddy generated when a rip part is removed.

The rib part 148 is disposed at the upper end of the coupling part 145. The rib part 148 protrudes from the upper end of the coupling part 145 toward the central portion of the base 141. The rib part 148 protrudes in a direction parallel to the bottom surface of the base 141. The rib part 148 overlaps a portion of the edge of the base 141 in plan view. The injection holes 142 are not disposed in the portion of the base 141 overlapping the rib part 148. The bottom surface of the rib part 148 is spaced apart from the top surface 141a of the base 141. The bottom surface of the rib part 148 is connected to the inner surface of the coupling part 145, and a connecting region therebetween is rounded. The top surface of the base 141 is connected to the inner surface of the coupling part 145, and a connecting region therebetween is rounded. A space 149 is disposed between the base 141 and the rib part 148, and an eddy of plasma is generated in the space 149. Referring to FIG. 4A, plasma P flowing along the top surface 141a of the base 141 to the edge thereof rotates along the inner surface of the coupling part 145 and the bottom surface of the rib part 148. At this point, particles included in the plasma P fall to the portion of the base 141 without the injection holes 142. In the related art as illustrated in FIG. 4B, the rib part 148 is removed from the baffle 140, the plasma P flowing along the top surface 141a generates an eddy in a space between the base 141 and the sealing cover 130. The eddy, generated along the inner surface of the coupling part 145 and the sealing cover 130 and the bottom surface of the sealing cover 130, is greater than the eddy of FIG. 4A, and is located over the injection holes 142. Thus, particles included in the plasma P fall together with a descending flow of the plasma P, and may arrive at the substrate W through the injection holes 142. However, in the current embodiment, an eddy of the plasma P is generated in the space 149 as a separate space, and the injection holes 142 are not disposed under the space 149, thereby protecting the substrate W from the particles of the eddy. In addition, since the connecting region between the top surface of the base 141 and the inner surface of the coupling part 145, and the connecting region between the bottom surface of the rib part 148 and the inner surface of the coupling part 145 are rounded, an eddy can be efficiently generated in the space 149 between the rib part 148 and the base 141.

The rib part 148 has a round surface at an end thereof. If the end of the rib part 148, which is directly exposed to plasma, is angled, ions included in plasma may be concentrated on the end of the rib part 148 so as to form an electric arc. The generated electric arc may damage the rib part 148, and generate particles. However, in the current embodiment, the rib part 148 has the round surface at the end thereof, thereby minimizing the generation of an electric arc.

Referring again to FIG. 1, the plasma generating part 300 is disposed above the sealing cover 130. The plasma generating part 300 generates plasma, and supplies the plasma to the introduction port 131 of the sealing cover 130. The plasma generating part 300 includes a plasma source portion 310, a gas supply pipe 320, a magnetron 330, and a waveguide 340.

The plasma source portion 310 is coupled to the sealing cover 130. Reaction gas supplied from the gas supply pipe 320, and microwaves supplied from the magnetron 330 generate plasma within the plasma source portion 310. The plasma generated within the plasma source portion 310 is supplied to the introduction port 131 of the sealing cover 130. The gas supply pipe 320 connects a gas storage part (not shown) to the plasma source portion 310, and supplies reaction gas stored in the gas storage part, to the plasma source portion 310. The magnetron 330 is installed on the plasma source portion 310, and generates microwaves for generating plasma. The waveguide 340 connects the magnetron 330 to the plasma source portion 310, and guides microwaves generated from the magnetron 330 to the plasma source portion 310.

Figure 5A:
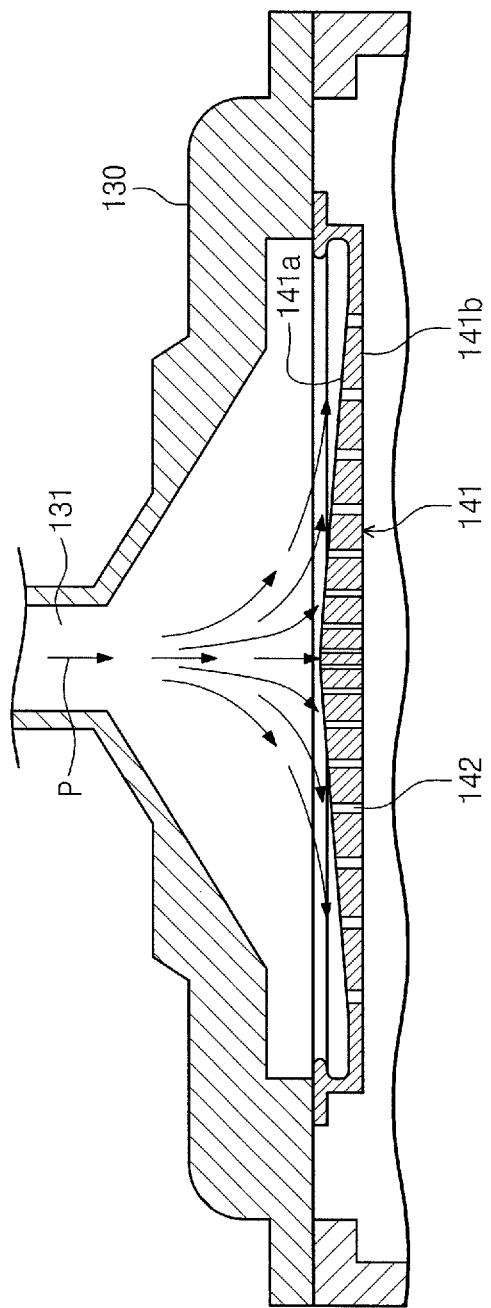
FIG. 5A is a cross-sectional view illustrating a state that plasma is supplied to the baffle within the substrate treating apparatus of FIG. 1.

FIG. 5A is a cross-sectional view illustrating a state that the plasma P is supplied to the baffle 140 within the substrate treating apparatus 1000 of FIG. 1.

Referring to FIG. 5A, the plasma P introduced into the introduction port 131 is supplied to the base 141. Since the introduction port 131 is disposed above the central portion of the base 141, most of the plasma P is supplied to the central portion of the base 141. The supplied plasma P moves from the central portion of the base 141 to the edge thereof along the top surface 141a. Since the central portion of the top surface 141a has a convex shape, the plasma P efficiently moves along the top surface 141a. Since the top surface 141a of the base 141 has a streamlined shape, bouncing of the plasma P against the base 141 can be decreased. Accordingly, the occurrence of an eddy of the plasma P between the base 141 and the sealing cover 130 can be minimized. Since the plasma P moves from the central portion of the base 141 to the edge thereof along the top surface 141a, the plasma P can be uniformly supplied to the entire top of the base 141. The supplied plasma P is uniformly supplied to a substrate through the injection holes 142.

Figure 5B:
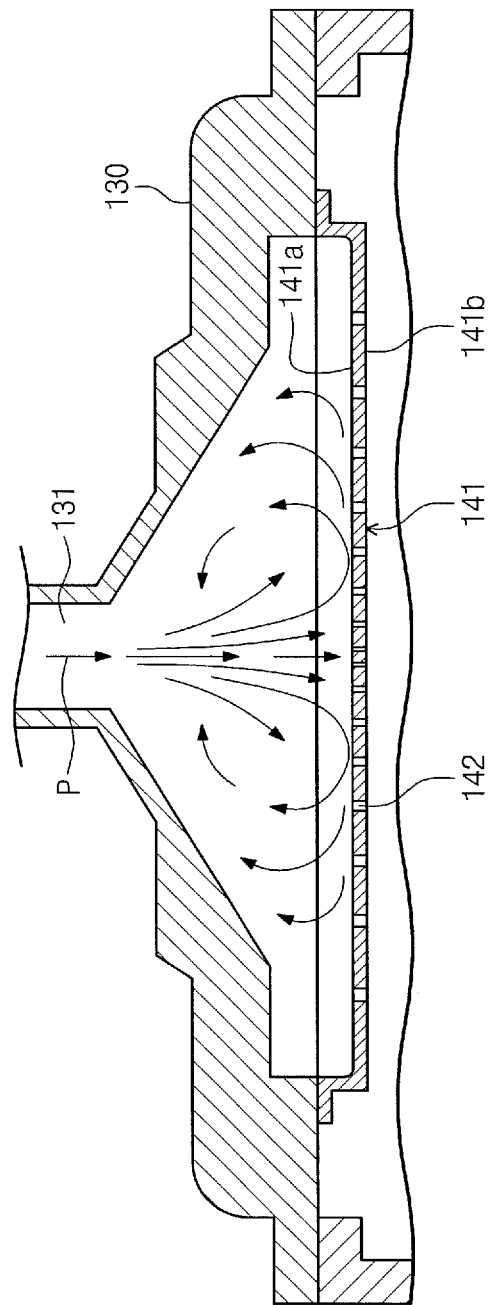
FIG. 5B is a cross-sectional view illustrating a state that plasma is supplied to a baffle having a flat top surface in the related art.

FIG. 5B is a cross-sectional view illustrating a state that plasma is supplied to a baffle having a flat top surface in the related art.

Referring to FIG. 5B, unlike FIG. 5A, a top surface 141a of a base 141 is substantially perpendicular to a descending flow of plasma P. Thus, bouncing of the plasma P against the top surface 141a is increased, and most of a bounced portion of the plasma P forms eddies over the central portion of the base 141. The eddies prevent the plasma P from moving to the edge of the base 141. Accordingly, a flow rate of a portion of the plasma P passing through second injection holes 142b disposed in the edge of the base 141 is different from a flow rate of a portion of the plasma P passing through first injection holes 142a disposed in the central portion of the base 141, whereby the plasma P is unevenly supplied to a substrate.

Figure 6:
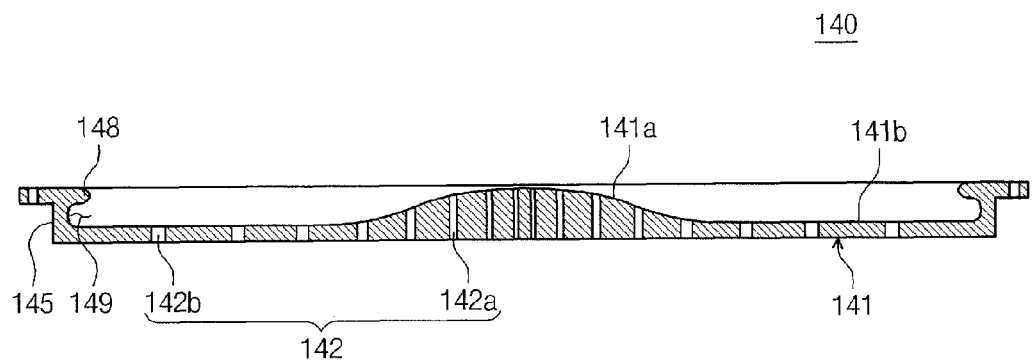
FIG. 6 is a cross-sectional view illustrating a baffle according to another embodiment of the present invention.

FIG. 6 is a cross-sectional view illustrating a baffle according to an embodiment of the present invention. Referring to FIG. 6, the central portion of a base 141 is thicker than the edge thereof. The base 141 includes a central portion 141a on the top surface thereof, and the central portion 141a is convex upward. The central portion 141a has a curved surface that may substantially correspond to the introduction port 131 of the sealing cover 130 (refer to FIG. 1). The base 141 includes an edge portion 141b on the top surface thereof, and the edge portion 141b has a flat surface. Plasma, introduced through the introduction port 131, is moved from the central portion 141a to the edge portion 141b along the top surface of the base 141.

Figure 7:
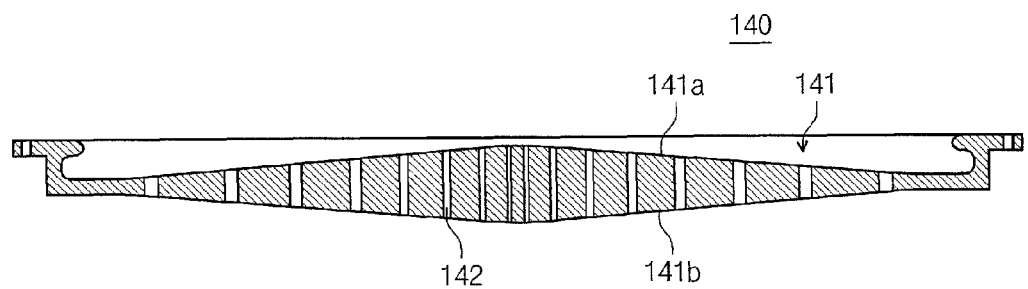
FIG. 7 is a cross-sectional view illustrating a baffle according to another embodiment of the present invention.

FIG. 7 is a cross-sectional view illustrating a baffle according to an embodiment of the present invention. Referring to FIG. 7, the central portion of a base 141 is thicker than the edge thereof. The base 141 gradually decreases in thickness from the central portion thereof to the edge thereof. The base 141 includes a top surface 141a that is convex upward. The base 141 includes a bottom surface 141b that is convex downward. The top surface 141a and the bottom surface 141b may have streamlined shapes. Plasma supplied to the base 141 moves from the central portion of the base 141 to the edge thereof along the top surface 141a.

Figure 8:
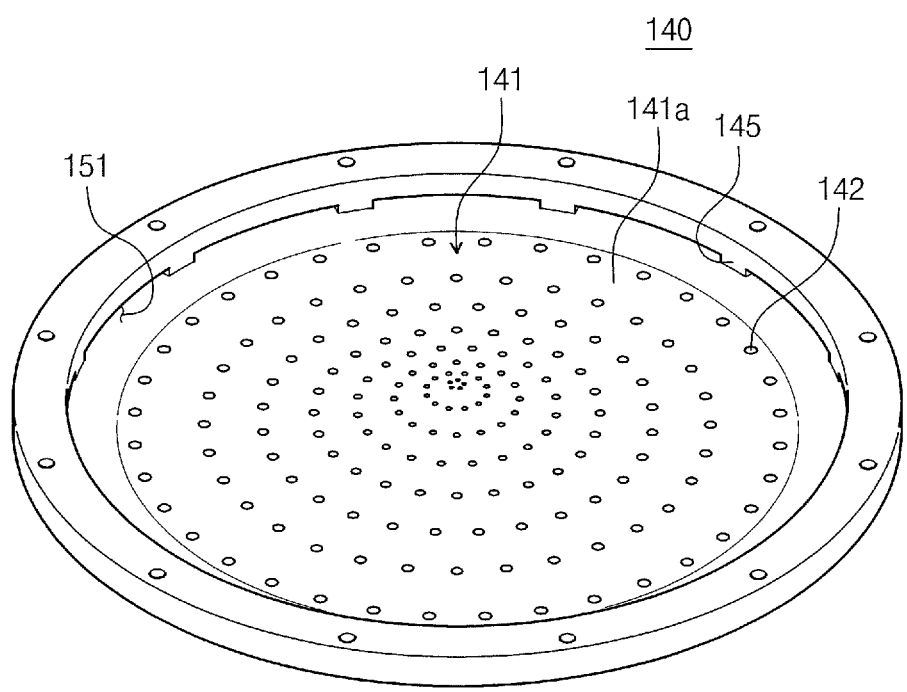
FIG. 8 is a perspective view illustrating a portion of a baffle according to another embodiment of the present invention.
Figure 9:
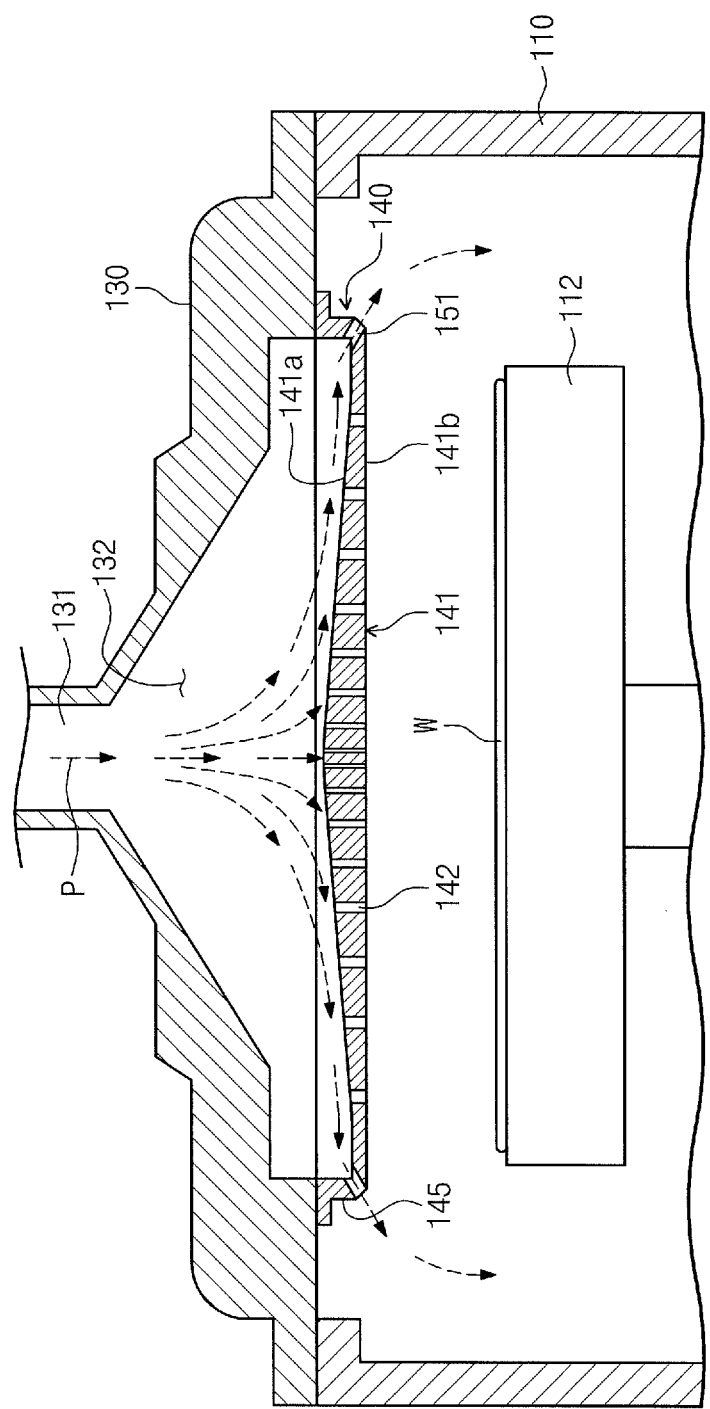
FIG. 9 is a cross-sectional view illustrating a state that plasma is supplied through the baffle of FIG. 8.

FIG. 8 is a perspective view illustrating a portion of a baffle according to an embodiment of the present invention. FIG. 9 is a cross-sectional view illustrating a state that plasma is supplied through the baffle of FIG. 8. Referring to FIGS. 8 to 9, exhausting holes 151 are disposed in a connecting region between a base 141 and a coupling part 145. The exhausting holes 151 are through holes obliquely and downwardly extending from the inner surface the coupling part 145 to the outer surface thereof. The exhausting holes 151 may be inclined from the central portion of the base 141 to the edge thereof in an inclination direction of a top surface 141a of the base 141. An inclination angle of the exhausting holes 151 may be different from the inclination angle of the top surface 141a by a certain angle. The inner space of the baffle 140 defined by the top surface 141a and the inner surface of the coupling part 145 is connected to a space formed under the baffle 140 by the exhausting holes 151. The exhausting holes 151 are spaced apart from one another along the circumference of the connecting region, and each of which has a slit shape with a certain length. The exhausting holes 151 function as passages through which particles included in plasma supplied to the baffle 140 are discharged to the lower outside of the baffle 140. Plasma supplied to the baffle 140 downwardly and obliquely moves along the top surface 141a to the edge of the base 141, and forms an eddy over the edge of the base 141. The eddy returns a portion of the plasma to the upper side of the central portion of the base 141. While the eddy is formed, another portion of the plasma and particles included therein are discharged to the lower outside of the baffle 140 through the exhausting holes 151. Accordingly, the amount of particles included in the returned portion of the plasma is decreased. Since the lower outside of the baffle 140 is the outside of a susceptor 121, the particles discharged through the exhausting holes 151 fall to the space between the inner surface of a housing 110 and the outer surface of the susceptor 121, thus preventing the particles from directly falling to a substrate W. Although not shown, the rib part 148 of FIG. 3 may be disposed at the upper end of the coupling part 145.

Although an ashing process using plasma is exemplified in the above embodiments, the present invention is not limited thereto, and thus, various processes using plasma, such as an etching process and a depositing process, may be exemplified.

According to the embodiments, since heat stress within a baffle is dispersed, thermal deformation of the baffle is prevented.

In addition, the generation of particles due to deformation of the baffle can be minimized.

In addition, since particles generated during a substrate treating process are maximally prevented from moving to a substrate, the contamination of a substrate due to particles can be prevented.

In addition, since plasma is uniformly supplied to the central and edge portions of the baffle, a substrate can be uniformly treated.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate treating apparatus comprising:
   a plasma generating part configured to generate plasma;
   a housing disposed under the plasma generating part, and having a first space therein;
   a susceptor disposed within the housing and supporting a substrate; and
   a baffle comprising injection holes injecting the plasma supplied from the plasma generating part, to the substrate;
   wherein the baffle comprises a base in which the injection holes are formed, and a central portion of the base is thicker than an edge portion thereof;
   wherein the baffle comprises a coupling part including a rib part protruding from an upper end of the coupling part toward the central portion of the base and a second space disposed between a portion of the base and the rib part for generating an eddy of the plasma therein; and
   wherein the injection holes are formed in the central portion and the edge portion of the base, such that the portion of the base where the second space is disposed is devoid of injection holes in order to protect the substrate from particles of the eddy.

2. The substrate treating apparatus of claim 1, further comprising a sealing cover that seals an open top of the housing, and comprises an introduction port through which plasma is introduced from the plasma generating part,
   wherein the central portion of the base faces the introduction port.

3. The substrate treating apparatus of claim 1, wherein the base gradually decreases in thickness from the central portion thereof to the edge portion thereof.

4. The substrate treating apparatus of claim 1, wherein the base has a curved top surface protruding upward, and a flat bottom surface.

5. The substrate treating apparatus of claim 1, wherein the base has a curved top surface protruding upward, and a curved bottom surface protruding downward.

6. The substrate treating apparatus of claims 1, wherein the injection holes comprise:
   a plurality of first injection holes disposed in the central portion of the base; and
   a plurality of second injection holes disposed in the edge portion of the base, and having radii greater than those of the first injection holes.

7. The substrate treating apparatus of claim 6, wherein a distance between the second injection holes is greater than a distance between the first injection holes.

8. The substrate treating apparatus of claim 1, wherein the coupling part has a ring shape and protrudes upward from an edge of the top surface of the base, and the upper end of the coupling part is higher than a central portion of the top surface of the base.

9. The substrate treating apparatus of claim 8, wherein the rib part is spaced apart from the top surface of the base.

10. The substrate treating apparatus of claim 9, wherein a connecting region between a bottom surface of the rib part and an inner surface of the coupling part, and a connecting region between the inner surface of the coupling part and the top surface of the base are rounded.

11. The substrate treating apparatus of claim 8, wherein an exhausting hole is disposed in a connecting region between the edge of the base and the coupling part, and is a through hole downwardly and obliquely extending from an inner surface of the coupling part to an outer surface thereof.

12. The substrate treating apparatus of claim 11, wherein the exhausting hole is provided in plurality, and the exhausting holes are spaced apart from each other along the coupling part, and have slit shapes.

13. A baffle comprising:
    a plurality of injection holes configured to inject plasma to a substrate; and
    a base in which the injection holes are formed, wherein a central portion of the base is thicker than an edge portion thereof; and
    a coupling part including a rib part protruding from an upper end of the coupling part toward the central portion of the base and a space disposed between a portion of the base and the rib part for generating an eddy of the plasma therein;
    wherein the plurality of injection holes are formed in the central portion and the edge portion of the base, such that the portion of the base where the space is disposed is devoid of the plurality of injection holes in order to protect the substrate from particles of the eddy.

14. The baffle of claim 13, wherein the base has a curved top surface protruding upward, and a flat bottom surface.

15. The baffle of claim 13, wherein the base has a curved top surface protruding upward, and a curved bottom surface protruding downward.

16. The baffle of claim 13, wherein the coupling part has a ring shape and protrudes upward from an edge of the top surface of the base, and wherein the upper end of the coupling part is higher than a central portion of the top surface of the base.

17. The baffle of claim 16, wherein the rib part is spaced apart from the top surface of the base.

18. The baffle of claim 16, further comprising exhausting holes that are disposed in a connecting region between the edge of the base and the coupling part, that are 1868/7d apart from each other along the coupling part, and that are through holes downwardly and obliquely extending from an inner surface of the coupling part to an outer surface thereof.

* * * * *